US012597757B2

(12) United States Patent (10) Patent No.: US 12,597,757 B2
Bosdas et al. (45) Date of Patent: Apr. 7, 2026

(54) OPTOELECTRONIC MODULE

(71) Applicant: ams Sensors Asia Pte. Ltd, Singapore (SG)

(72) Inventors: Ilias Bosdas, Zurich (CH); Ian Kilburn, Langnau am Albis (CH); Hartmut Rudmann, Singapore (SG)

(73) Assignee: AMS SENSORS ASIA PTE. LTD, Singapore (SG)

( * ) Notice: Subject to any disclaimer, the term of this patent is extended or adjusted under 35 U.S.C. 154(b) by 775 days.

(21) Appl. No.: 17/785,292

(22) PCT Filed: Dec. 17, 2020

(86) PCT No.: PCT/SG2020/050759
§ 371 (c)(1),
(2) Date: Jun. 14, 2022

(87) PCT Pub. No.: WO2021/126086
PCT Pub. Date: Jun. 24, 2021

(65) Prior Publication Data
US 2023/0008903 A1 Jan. 12, 2023

Related U.S. Application Data

(60) Provisional application No. 62/949,176, filed on Dec. 17, 2019.

(51) Int. Cl.
*H01S 5/02257* (2021.01)
*H01S 5/02253* (2021.01)
(Continued)

(52) U.S. Cl.
CPC ........ *H01S 5/0232* (2021.01); *H01S 5/02253* (2021.01); *H01S 5/02257* (2021.01);
(Continued)

(58) Field of Classification Search
None
See application file for complete search history.

(56) References Cited

U.S. PATENT DOCUMENTS 10,511,139 B2 * 12/2019 Schrama ............. H01S 5/06825
10,667,341 B1 * 5/2020 Kriman .............. G02B 27/4233
(Continued)

FOREIGN PATENT DOCUMENTS

CN 106158783 A 11/2016
CN 106206510 A 12/2016
(Continued)

OTHER PUBLICATIONS

Chinese Office Action issued in corresponding Chinese Patent Application No. 202080085977.1, dated Dec. 30, 2024, with English translation, 18 pages.
(Continued)

*Primary Examiner* — Tod T Van Roy
(74) *Attorney, Agent, or Firm* — MH2 Technology Law Group LLP

(57) ABSTRACT

A support structure for mounting an optical assembly above an optoelectronic device, the optical assembly comprising an electrically conductive structure, the support structure comprising: a first surface for supporting an optical assembly; and an electrically conductive lead, wherein said electrically conductive lead comprises: a first electrical interface portion adjacent to the first surface for forming an electrical contact with an electrically conductive structure of an optical assembly supported by the first surface; a second electrical interface portion on a side opposing the first surface, and wherein the electrically conductive lead extends from the first electrical interface portion to the second electrical interface portion so as to maintain an optical assembly
(Continued)

supported on the first surface and the second electrical interface portion in electrical contact.

16 Claims, 6 Drawing Sheets

(51) Int. Cl.

| | |
|---|---|
| *H01S 5/0232* | (2021.01) |
| *H01S 5/0239* | (2021.01) |
| *H01S 5/068* | (2006.01) |
| *H01S 5/183* | (2006.01) |

(52) U.S. Cl.

CPC ........ *H01S 5/0239* (2021.01); *H01S 5/06825* (2013.01); *H01S 5/183* (2013.01)

(56) References Cited

U.S. PATENT DOCUMENTS

| | | | | |
|---|---|---|---|---|
| 10,738,985 | B2 * | 8/2020 | Hannan | H01S 5/06825 |
| 10,816,176 | B1 * | 10/2020 | Lee | F21K 9/00 |
| 10,818,829 | B2 * | 10/2020 | Jin | H10H 20/858 |
| 10,876,705 | B2 * | 12/2020 | Suzuki | H01S 5/06825 |
| 10,935,193 | B2 * | 3/2021 | Vogt | H01S 5/0683 |
| 10,978,852 | B2 * | 4/2021 | Kitajima | H01S 5/06825 |
| 11,056,855 | B2 * | 7/2021 | Lee | H01S 5/06804 |
| 11,150,330 | B2 * | 10/2021 | Lee | G03B 21/2033 |
| 11,205,731 | B2 * | 12/2021 | Lee | H10F 55/18 |
| 11,257,998 | B2 * | 2/2022 | Lee | H10H 20/857 |
| 11,262,060 | B2 * | 3/2022 | Tsai | H01S 5/0425 |
| 12,055,633 | B2 * | 8/2024 | Shi | G03B 17/02 |
| 12,142,891 | B2 * | 11/2024 | Kim | H01S 5/02345 |
| 12,199,403 | B2 * | 1/2025 | Tsai | H01S 5/0014 |
| 12,203,645 | B2 * | 1/2025 | Kato | F21V 31/005 |
| 2011/0233571 | A1 * | 9/2011 | Park | H10H 20/857 |
| | | | | 257/E27.12 |
| 2016/0290856 | A1 * | 10/2016 | Fiederling | F21S 45/70 |
| 2017/0287801 | A1 | 10/2017 | Chou | |
| 2017/0353004 | A1 * | 12/2017 | Chen | H01S 5/02234 |
| 2019/0237935 | A1 * | 8/2019 | Schrama | H01S 5/4018 |
| 2019/0278104 | A1 * | 9/2019 | Chen | G02C 7/02 |
| 2019/0376676 | A1 * | 12/2019 | Hannan | H01S 5/02257 |
| 2019/0378866 | A1 * | 12/2019 | Lin | H10F 77/50 |
| 2019/0379173 | A1 * | 12/2019 | Coffy | H01S 3/034 |
| 2020/0251458 | A1 * | 8/2020 | Tsai | H01L 25/115 |
| 2021/0273401 | A1 * | 9/2021 | Balimann | H01S 5/0236 |
| 2022/0029381 | A1 * | 1/2022 | Ripoll | F21V 25/02 |
| 2022/0294179 | A1 * | 9/2022 | Sakai | H01S 5/06825 |
| 2023/0008903 | A1 * | 1/2023 | Bosdas | H01S 5/023 |
| 2023/0058904 | A1 * | 2/2023 | Flores Parra | H01S 5/0239 |

FOREIGN PATENT DOCUMENTS

| | | |
|---|---|---|
| CN | 108832475 A | 11/2018 |
| CN | 110324991 A | 10/2019 |
| WO | WO-2024046441 A1 * | 3/2024 |

OTHER PUBLICATIONS

Herve, Denis (EP Authorized Officer), International Search Report and Written Opinion in corresponding in International Application No. PCT/SG2020/050759 mailed on Mar. 30, 2021, 11 pages.

* cited by examiner

OPTOELECTRONIC MODULE

TECHNICAL FIELD OF THE DISCLOSURE

This disclosure relates to compact optoelectronic modules and their manufacture.

BACKGROUND OF THE DISCLOSURE

Various consumer electronic products and other devices include a packaged light emitter or detector modules designed for precision light projection or detection applications. The spatial dimensions of such modules are generally extremely small, thereby enabling their incorporation into portable devices. One technology that is suitable for miniature illuminators is high power vertical cavity surface emitting laser (VCSEL) devices and VCSEL array devices.

The dimensions of such miniature electronic packages must be controlled with high precision in order to ensure optimal function of the module. However, certain manufacturing techniques, such as the application of adhesive within the package, may make it difficult to achieve the necessary standards of precision.

Further, the optical output power of a bare VCSEL typically can, in some cases, be so high that it may cause damage to a person's eye or skin in the event the quality of the optical component is compromised. Thus, it is important to ensure that the high power laser illuminators meet laser safety regulations when in operation. For example, the illuminator may be part of an assembly that, under normal operating conditions, maintains eye-safe operation by preventing a person from getting too close to the illuminator. However, in some cases, damage (e.g. cracks) to the optical structure that modifies the output beam for safe operation, or the presence of moisture or chemical contamination on the optical structure, may result in safety hazards. Likewise, if the optical structure were to fall off or be removed, safety could be compromised.

It is therefore an aim of the present disclosure to provide an optoelectronic module that addresses one or more of the problems above or at least provides a useful alternative.

SUMMARY

In general this disclosure proposes to overcome the above problems by facilitating the detection of damage or the presence of moisture or chemical contamination on the optical structure. The arrangement does so without compromising the optical performance of the module and enabling straightforward manufacture.

According to one aspect of the present disclosure, there is provided a support structure for mounting an optical assembly above an optoelectronic device, the optical assembly comprising an electrically conductive structure, the support structure comprising: a first surface for supporting an optical assembly; and an electrically conductive lead, wherein said electrically conductive lead comprises: a first electrical interface portion adjacent to the first surface for forming an electrical contact with an electrically conductive structure of an optical assembly supported by the first surface; a second electrical interface portion on a side opposing the first surface, and wherein the electrically conductive lead extends from the first electrical interface portion to the second electrical interface portion so as to maintain an optical assembly supported on the first surface and the second electrical interface portion in electrical contact.

According to another aspect of the invention, there is provided a support structure for mounting an optical assembly above an optoelectronic device, the optical assembly comprising an electrically conductive structure, the support structure comprising: a first surface for supporting an optical assembly; and an electrically conductive lead, wherein said electrically conductive lead comprises: a first electrical interface portion adjacent to the first surface; a first recess in said first surface, wherein the first recess comprises one or more walls defining a volume for receiving electrically conductive fluid, wherein the volume is open at the first surface but is otherwise closed, and wherein at least a portion of the one or more walls of the recess is formed from the first electrical interface portion of the electrically conductive lead such that an electrically conductive fluid received in the recess maintains the first electrical interface portion of the electrically conductive lead and an electrically conductive structure of an optical assembly supported by the surface in electrical connection.

The optical assembly may comprise an optical component, for example, a microlens array (MLA), an optical diffuser, a lens, a refractive or diffractive optical element, a diffuser, a spectral filter, a polarizing filter, and/or some other optical structure operable to modify the optical characteristics of the output beam of the light source, which is incident on the optical assembly. In some cases, the optical assembly is operable to produce a structured-light emission.

The optoelectronic device may comprise a VCSEL, an array of VCSELs, one or more light emitting diodes (LEDs), infra-red (IR) LEDs, organic LEDs (OLEDs), infra-red (IR) lasers, or edge-emitting laser diodes.

It should be understood that the term electrically conductive fluid is used herein to denote a fluid which is capable of being cured by heating or any other means and which is electrically conductive in at least its hardened state following curing. The electrically conductive fluid may comprise electrically conductive adhesive. The electrically conductive fluid may comprise electrically conductive epoxy. The electrically conductive fluid may be a heat-curable fluid.

The electrically conductive structure may be a trace. The trace may be a resistive or a capacitive trace. The trace may be configured to detect moisture on the surface of the optical assembly or damage to the optical assembly. The electrically conductive structure may be transparent. The electrically conductive structure may be opaque. The electrically conductive structure may comprise interface portions for forming an electrical connection with the leads. The interface portion of the electrically conductive structure may be one or more contact pads.

The support structure may be a spacer. The support structure may comprise electrically insulating material. The support structure may support the optical assembly at the correct distance from the optoelectronic device to produce a structured-light emission.

The electrically conductive lead may comprise a trace. The second electrical interface portion may be configured to enable electrical connection with a leadframe. The side opposing the first surface may be configured to interface with a leadframe on which an optoelectronic device is disposed. The side opposing the first surface may be intergral with a leadframe on which an optoelectronic device is disposed.

The second electrical interface portion may be in electrical contact with a leadframe on which the optical element is mounted. Thus, the electrically conductive lead may maintain an optical assembly supported on the first surface in electrical contact with a leadframe on which an optical element may or may not be mounted. The second electrical interface portion may be in electrical contract with a lead-frame on which the optical element is mounted via electrically conductive fluid.

The support structure may comprise more than recess for receiving electrically conductive fluid. The support structure may comprise two leads and two corresponding recesses for receiving electrically conductive fluid.

Thus, embodiments of this disclosure provide a support structure enabling electrical connection in the z-direction down the support structure from the optical assembly to a leadframe.

All of the one or more walls of the first recess may be formed from the first interface portion of the electrically conductive lead.

Thus, embodiments of this disclosure enable straightforward dispensing of electrically conductive fluid during assembly of the optoelectronic structure and ensure electrical connection of the optical assembly to the leadframe The support structure may comprise a plurality of sidewalls extending from the first surface such that the sidewalls define a continuous border surrounding an optical assembly supported by the first surface. The sidewalls may define a socket for receiving an optical assembly. The sidewalls may be sufficiently spaced from the optical assembly to enable the dispensing of electrically conductive fluid to the recesses when the optical assembly is supported by the first surface.

The support structure may be electrically insulating, save for the electrically conductive lead.

The first recess may be positioned such that it is at least partially covered by an optical assembly supported on the first surface. The first recess may be positioned such that a portion of the recess remains uncovered when an optical assembly is supported on the first surface. The uncovered portion may be sufficiently large as to enable dispensing of electrically conductive fluid to the recess while the optical assembly is in position on the first surface.

One or more walls of the first recess may be substantially curved. The first recess may have a substantially recessed spherical cap shape or recessed ellipsoidal cap shape.

Thus, embodiments of this disclosure enable straightforward assembly of an optical module as the curved shape of the recess drives the electrically conductive fluid up towards the contact regions of the optical assembly as it is dispensed.

The support structure have a spacer (standoff) on the first surface. The support structure may have several spacers (standoffs) on the first surface. The support structure may have five or more spacers (standoffs) on the first surface. The optical assembly may sit on the spacer/s (standoff/s). The spacer/s (standoff/s) may act as a barrier to prevent mechanical adhesive entering the first recess. Mechanical adhesive may be applied to the first surface between the spacers (standoffs).

Thus embodiments of this disclosure enable precise positioning of the optical assembly above the optoelectronic device as the spacers mean that the position of the optical assembly is invariant to the thickness of mechanical adhesive employed.

In an further aspect of the present disclosure, there is provided an optoelectronic module comprising: a support structure for mounting an optical assembly above an optoelectronic device, the optical assembly comprising an electrically conductive structure, the support structure comprising: a first surface for supporting an optical assembly; and an electrically conductive lead, wherein said electrically conductive lead comprises: a first electrical interface portion adjacent to the first surface; a first recess in said first surface, wherein the first recess comprises one or more walls defining a volume for receiving electrically conductive fluid, wherein the volume is open at the first surface but is otherwise closed, and wherein at least a portion of the one or more walls of the recess is formed from the first electrical interface portion of the electrically conductive lead such that an electrically conductive fluid received in the recess maintains the first electrical interface portion of the electrically conductive lead and an electrically conductive structure of an optical assembly supported by the surface in electrical connection; an optical assembly comprising an electrically conductive structure positioned on the first surface; adhesive attaching said optical assembly to the first surface; and conductive fluid disposed in the first recess and in contact with the electrically conductive structure, so as to maintain the electrically conductive lead and the electrically conductive structure in electrical connection.

The adhesive attaching the optical assembly to the first surface may be mechanical adhesive. The adhesive attaching the optical assembly to the first surface may be heat-curable adhesive. The adhesive attaching the optical assembly to the first surface may be different from the conductive fluid. The adhesive attaching the optical assembly to the first surface may have a different curing profile from the electrically conductive fluid.

The optoelectronic module may further comprise: an electrically conductive trace; an optoelectronic device mounted on the electrically conductive trace and being operable to emit or detect light through the optical assembly, wherein the electrically conductive lead is in electrical connection with the electrically conductive trace.

In a further aspect of the present disclosure, it is provided: a method of manufacturing an optoelectronic module comprising: a support structure for mounting an optical assembly above an optoelectronic device, the optical assembly comprising an electrically conductive structure, the support structure comprising: a first surface for supporting an optical assembly; and an electrically conductive lead, wherein said electrically conductive lead comprises: a first electrical interface portion adjacent to the first surface; a first recess in said first surface, wherein the first recess comprises one or more walls defining a volume for receiving electrically conductive fluid, wherein the volume is open at the first surface but is otherwise closed, and wherein at least a portion of the one or more walls of the recess is formed from the first electrical interface portion of the electrically conductive lead such that an electrically conductive fluid received in the recess maintains the first electrical interface portion of the electrically conductive lead and an electrically conductive structure of an optical assembly supported by the surface in electrical connection; an optical assembly comprising an electrically conductive structure positioned on the first surface; adhesive attaching said optical assembly to the first surface; and conductive fluid disposed in the first recess and in contact with the electrically conductive structure, so as to maintain the electrically conductive lead and the electrically conductive structure in electrical connection, the method comprising: applying adhesive to the first surface; positioning the optical assembly on the first surface; thermally curing the mechanical adhesive; once the mechanical adhesive is thermally cured, introducing electrically conductive fluid into the first recess; thermally curing the electrically conductive fluid.

Prior to thermally curing the adhesive, the adhesive may be partially cured using ultraviolet light.

Finally, the optical assembly disclosed herein utilises a novel approach in recesses are provided in the spacer in order to enable electrical connection from the trace to the leadframe on which the optical element is mounted.

BRIEF DESCRIPTION OF THE PREFERRED EMBODIMENTS

Some embodiments of the disclosure will now be described by way of example only and with reference to the accompanying drawings, in which.

DETAILED DESCRIPTION OF THE PREFERRED EMBODIMENTS

Generally speaking, the disclosure provides an optoelectronic module solution which provides high sensitivity to damage to the optical component without compromising optical performance and is straightforward to assemble.

Some examples of the solution are given in the accompanying figures.

Figure 1A:
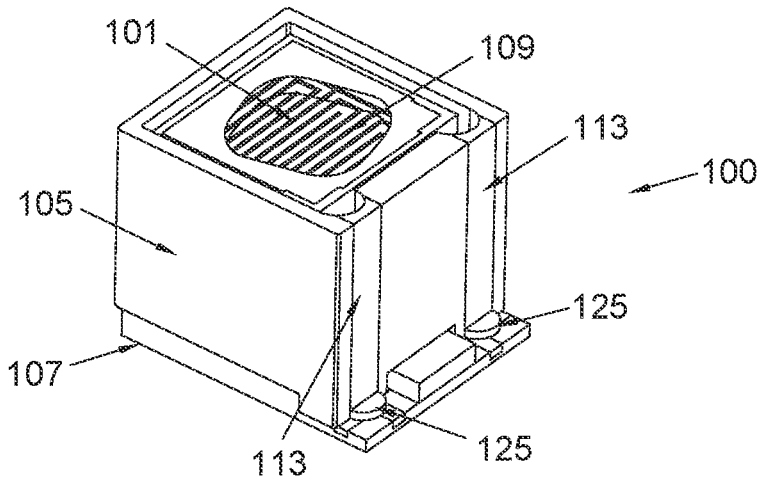
FIG. 1A shows a perspective view of an infrared illuminator according to an embodiment.
Figure 1B:
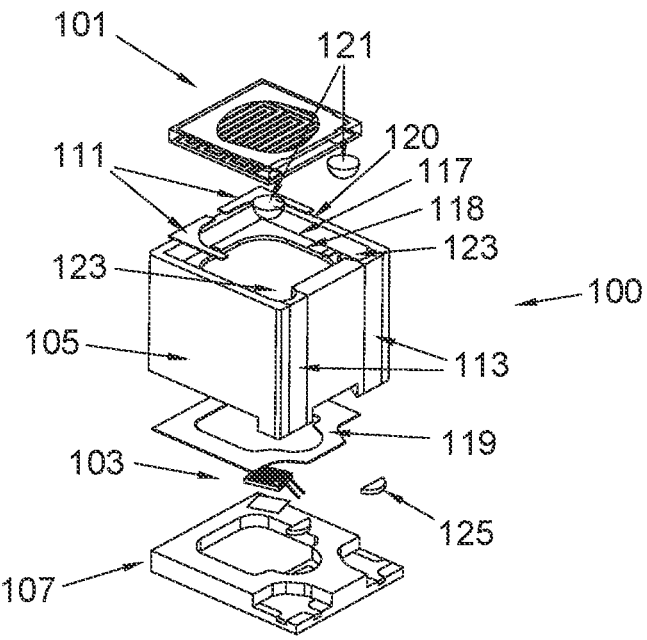
FIG. 1B shows a perspective view of the infrared illuminator of FIG. 1A.

An optoelectronic module 100 comprising an infrared illuminator according to an embodiment is shown in FIGS. 1A and 1B, which show perspective and exploded views of the module respectively. In this embodiment, the optoelectronic module comprises an optical assembly 101 in the form of a glass with a microlens array (MLA) disposed over an optoelectronic device 103 in the form of a vertical cavity surface emitting laser (VCSEL) configured to emit light through the glass 101. The VCSEL 103 is electrically connected to leadframe 107 via which power is supplied to the VSCEL 103. In an embodiment, power to the VCSEL may be controlled by a current driver controller or other electronic control unit (ECU) (not shown). The controller can reside, for example, in a host device (e.g., smartphone) into which the module 100 is integrated.

Although the embodiment of FIG. 1 is directed to an optoelectronic module with a VSCEL, other types of optical emitters or even detectors may be employed in the optoelectronic module according to embodiments. Examples include an array of VCSELs, one or more light emitting diodes (LEDs), infra-red (IR) LEDs, organic LEDs (OLEDs), infra-red (IR) lasers, or edge-emitting laser diodes. In general, the light source is operable to emit light at a particular wavelength or at any wavelength range (e.g. infra-red). In certain embodiments, the light source is operable to generate coherent light.

Likewise, other optical assemblies such as an optical diffuser, a lens, a refractive or diffractive optical element, a diffuser, a spectral filter, a polarizing filter, and/or some other optical structure operable to modify the optical characteristics of the output beam of the light source, which is incident on the optical assembly may be employed in place of the MLA according to embodiments.

An electrically conductive structure 109 in the form of an electrical trace is disposed on a surface of the MLA glass 101. In this embodiment, the electrical trace is an interdigital resistor. In other embodiments, the electrical trace may comprise a capacitor or other electrically conductive structure. In some cases, the trace 109 is composed of a material (e.g., indium tin oxide (ITO)) that is substantially transparent to the wavelength of light produced by the VCSEL (e.g., infra-red). Such electrically conductive structures thus can at least partially overlap a footprint of the optical beam emitted by the VCSEL. In other instances, the electrically conductive structure can be composed of a material (e.g., chrome) that is substantially opaque to the wavelength of light produced by the light emitter. In such cases, the electrically conductive structure preferably does not overlap the footprint of an optical beam emitted by the VCSEL.

The trace 109 is connected to conductive pads 303 on the surface of the MLA glass. In some instances, the trace 109 is covered with an insulating layer (e.g., SiO2) having openings for the conductive pads 303, which in some cases, are composed of gold or another suitable conductive material.

In the embodiment of FIG. 1, the function of the MLA trace is to ensure eye-safety of the module. As discussed above, the unmodified optical output of a VCSEL may be sufficient to cause injury if incident of a human eye or skin. It is therefore important that any conditions or damage which may compromise the function of the optical module resulting in a change in the optical output are detected. In this embodiment, this is achieved by monitoring of the capacitance or the resistance (as appropriate) of the trace 109. When the glass breaks, or moisture is present on the MLA glass, both which could compromise the eye safety of the package, the signal from the trace will alter. Thus, any alteration in the signal from the trace may indicate that the module is no longer eye-safe and that use should cease.

In an embodiment, the electrically conductive trace 109 forms part of an electrical circuit that is coupled to a current driver controller or other electronic control unit (ECU) which controls power to the VCSEL, as discussed above. This driver controller or ECU may be external to the module 100. In this embodiment, the controller is operable to monitor an electrical characteristic (e.g., electrical continuity; or capacitance, as appropriate) of the trace 109 such that if the monitored characteristic changes by more than a predetermined amount, the controller regulates the optical output of the VCSEL or other light source according to embodiments. In an embodiment, the controller is operable to monitor the electrical characteristic of the trace such that if the monitored characteristic changes by more than a respective predetermined amount, the controller causes the optical output produced by the light source to be stopped. For example, the driver can turn off the VCSEL 103 so that it no longer emits light.

The MLA glass 103 is held in position above the VCSEL 103 by a support structure 105 in the form of a spacer according to an embodiment. The spacer has a cavity 403 through which the light emitted by the VCSEL 103 passes. The VCSEL is mounted on the leadframe 107. The spacer 105 may comprise, for example, a Molded Interconnect Device (MID) that permits the selective metallization of a molded structure and enables the creation of 3D dimensional metallic patterns in the device (e.g., using a liquid crystal polymer-based material). The MLA glass 101 resides in a socket 117 of the spacer and is mechanically affixed to the spacer 105 using adhesive 111. This will be discussed in further detail below. In an embodiment, the socket 117 comprises a surface 118 on which supports the MLA when positioned in the socket and sidewalls 120 which extend from the surface 118 and define a border surrounding the MLA when in position. In the embodiment of FIG. 1, the sidewalls define a continuous border around the MLA when in position. In other embodiments, there may be breaks in the border or no border at all. In the module 100 shown in FIG. 1, mechanical bonding between the spacer 105 and the lead frame 107 is achieved with an adhesive layer 119 between the two. In other embodiments, other methods of mechanically affixing the spacer to the lead frame may be employed. In an embodiment, the spacer is formed as an overmold to the leadframe.

The spacer according to this embodiment has a number of advantageous features according to embodiments which facilitate both precise positioning of the MLA glass 101 above the VCSEL 103 and monitoring of the output signal of trace 109, in accordance with the eye-safety feature described above.

Figure 2A:
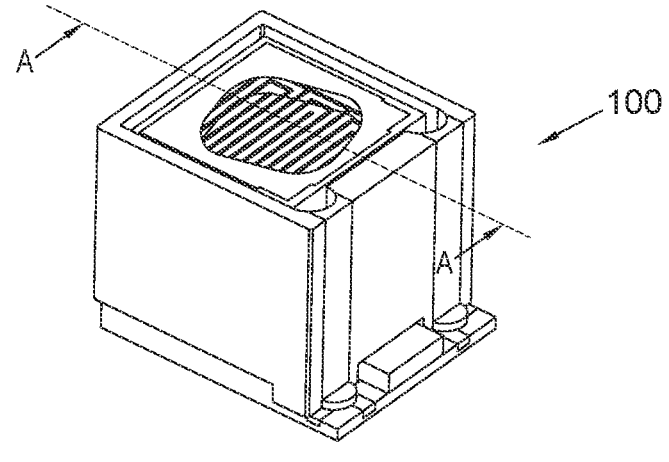
FIGS. 2A and 2B show a cross-sectional view of the illuminator of FIG. 1A.
Figure 2B:
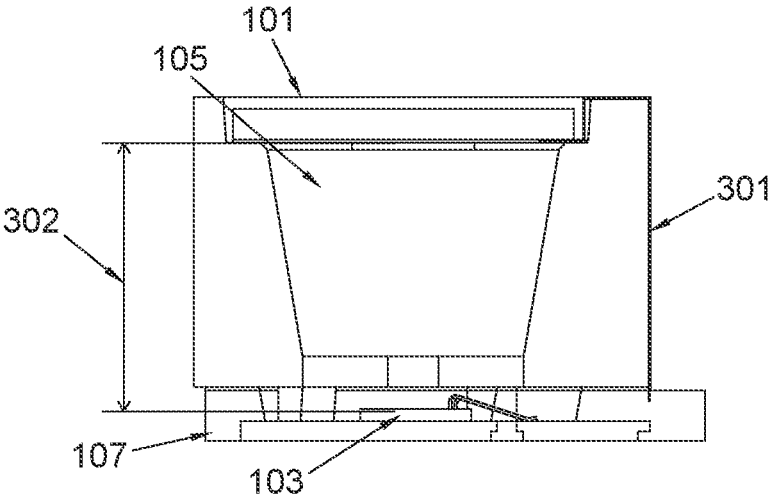

FIG. 2B shows a cross-sectional view of the illuminator package, the cross section taken across the line A shown in FIG. 2A. For correct functional performance of the package 100, it is important that the distance 302 between the optoelectronic device (VSCEL) and the optical assembly (MLA) is precisely controlled in order to ensure correct focusing distance of the MLA. Movement in the x, y and z directions will all have an impact on the optical performance of the device. Further, in order to implement the eye-safety feature of the MLA glass 101 described, it is desirable for the trace 109 to be in electrical connection 301 down the spacer 105 to leadframe 107, thereby enabling monitoring of the trace by a current driver controller or other electronic control unit (ECU) via the leadframe 107. The spacer 105 achieves these objectives in a number of ways, as will now be described in detail.

In this embodiment, electrical connection between the electrical trace of the MLA glass 101 and the leadframe 107 is achieved with electrically conductive leads 113 which extend from the top of the spacer 105 down the side of the spacer to the leadframe 107.

In the embodiment of FIG. 1 these leads comprise electrically plated traces, which extend the full height of the spacer. However, other electrically conductive structures extending from the top to the bottom of the spacer may be employed according to embodiments. At the top of the spacer, within the socket in which the MLA glass 101 sits, are electrically plated recesses 123 which are in electrical connection with the leads 113.

Although a continuous electrically plated trace exists from the recesses to the base of the spacer in the embodiment of FIG. 1 any structure which ensures that the recesses are in electrical connection with the base of the spacer may be employed according to embodiments.

Figure 3A:
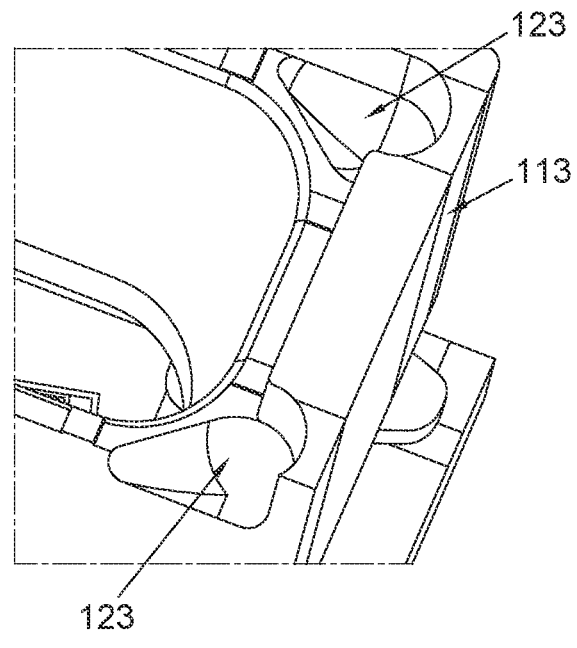
FIG. 3A shows a perspective view of a portion of a spacer according to an embodiment.
Figure 3B:
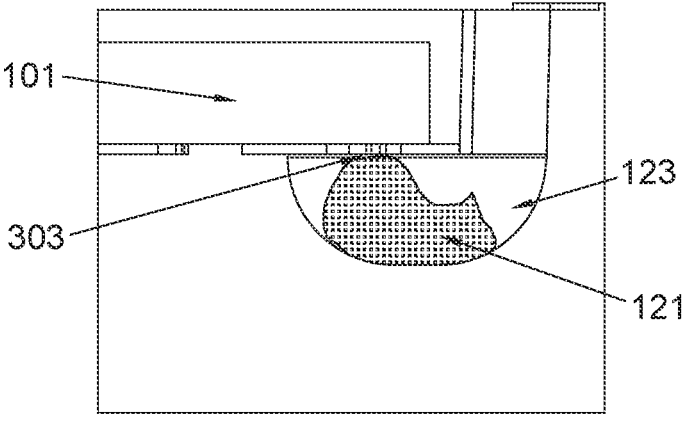
FIG. 3B shows a cross-sectional view of the spacer of FIG. 3A.

An enlarged view of the recesses 123 is shown in FIGS. 3A and 3B which show a perspective view of the spacer without the MLA in position and a cross sectional view of the spacer with MLA glass 101 in position respectively. In this embodiment, the recesses have a cap-shaped geometry. The significance of such a geometry will become apparent from the discussion below. However, other recess geometries including straight-edged recesses may be employed according to embodiments. As can be seen from FIG. 3B, there are two continuous electrically plated traces which extend up the side of the spacer (the leads 113) and over the top into each recess.

As can be seen from FIG. 3B, when the MLA glass 101 is in position, a portion of each recess extends beneath it.

In the assembled module 100 according to this embodiment, the recesses contain electrically conductive fluid 121 in the form of conductive paste. An example of conductive paste suitable for use in this embodiment is silver paste. Other electrically conductive pastes may be employed according to embodiments. The conductive paste 121 makes contact with electrical contacts on the base of the MLA glass. As the recesses are electrically plated, this forms an electrical connection between the trace of the MLA glass 101 and the recesses 123 which are themselves in electrical connection with the leads 113. The conductive paste 121, thereby enables electrical connection between the trace 109 of the MLA glass 101 and the leads 113. Further electrically conductive fluid 125 in the form of electrically conductive paste is positioned between the spacer 105 and the lead frame 107, providing electrical contact between the leadframe and the traces 113.

Thus, electrical connection 301 down the spacer from the MLA trace 109 to the leadframe 107 is achieved via the conductive paste 121, recesses 123, leads 113 and conductive paste 125.

As discussed above, in this embodiment, electrical connection between the MLA trace and the leadframe is employed to ensure eye safety in the device. In other embodiments, an electrical connection from the top to the bottom of the package may be desirable for other reasons, such as deforming the lens in combination with a capacitive trace, etc.

Figure 4:
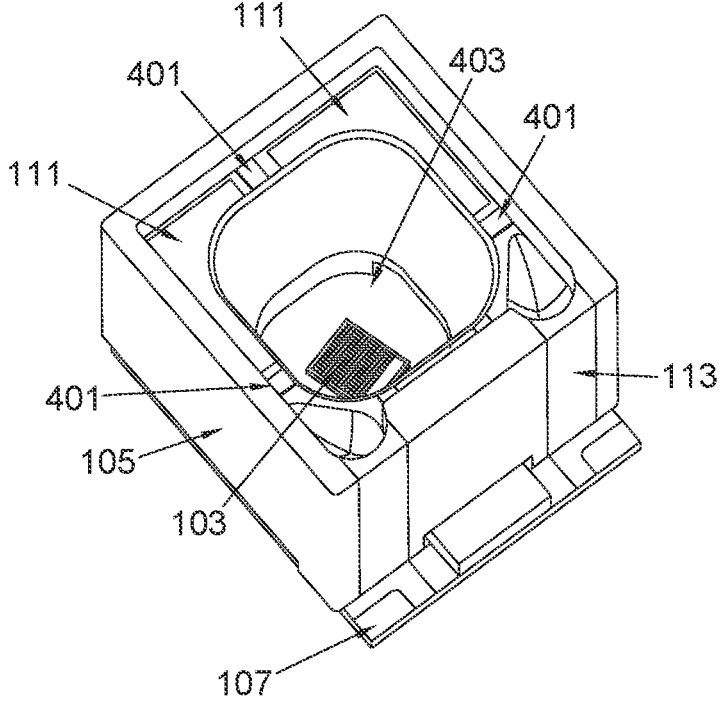
FIG. 4 shows a full perspective view of the spacer of FIG. 3A.

As described above, the MLA glass 101 is affixed to the space 105 with adhesive 111. FIG. 4 shows a perspective view of the spacer without the MLA glass 101 in order to emphasise the positioning of the adhesive 111 within the socket 117 of the spacer. The spacer 103 has a number of spacers 401 in the form of standoffs on which the MLA glass 101 rests directly when in position in the socket 117. In this embodiment, five standoffs are spaced around the socket of the spacer (two are not visible in FIGS. 1B and 2) in order to provide stable support to the MLA glass when in position. The adhesive layer 111 is applied between the standoffs 401. The standoffs 401 protrude above the surface onto which adhesive is applied. No adhesive is applied to the upper surface of the standoffs themselves.

Because the MLA glass rests directly on the standoffs 401 and not the surface on which adhesive 111 is applied, the presence of the standoffs 401 facilitates the precise positioning of the MLA glass above the VCSEL 103, which enables optimal functioning of the module 100. In particular, the standoffs allow for variations in the thickness of the adhesive while maintaining the MLA glass at the correct focusing distance from the VCSEL; the positioning of the MLA glass 101 will not vary as long as the thickness of the adhesive is maintained below the height of the standoffs 401. The standoffs 401 also provide a barrier to the mechanical adhesive entering the recesses 123 during the manufacturing process. This will be described in further detail below. In an embodiment, the adhesive is an epoxy.

Similarly in addition to facilitating electrical connection from the top to the bottom of the package 100, the recesses ensure that the distance of the VCSEL 103 from the MLA glass 101 will be invariant to the thickness of the conductive paste, as long as it is maintained below the height of the recesses.

Further features which contribute to the precise positioning of the MLA in relation to the VCSEL will be described below in relation to the process of manufacturing the package in accordance with an embodiment.

Figure 5:
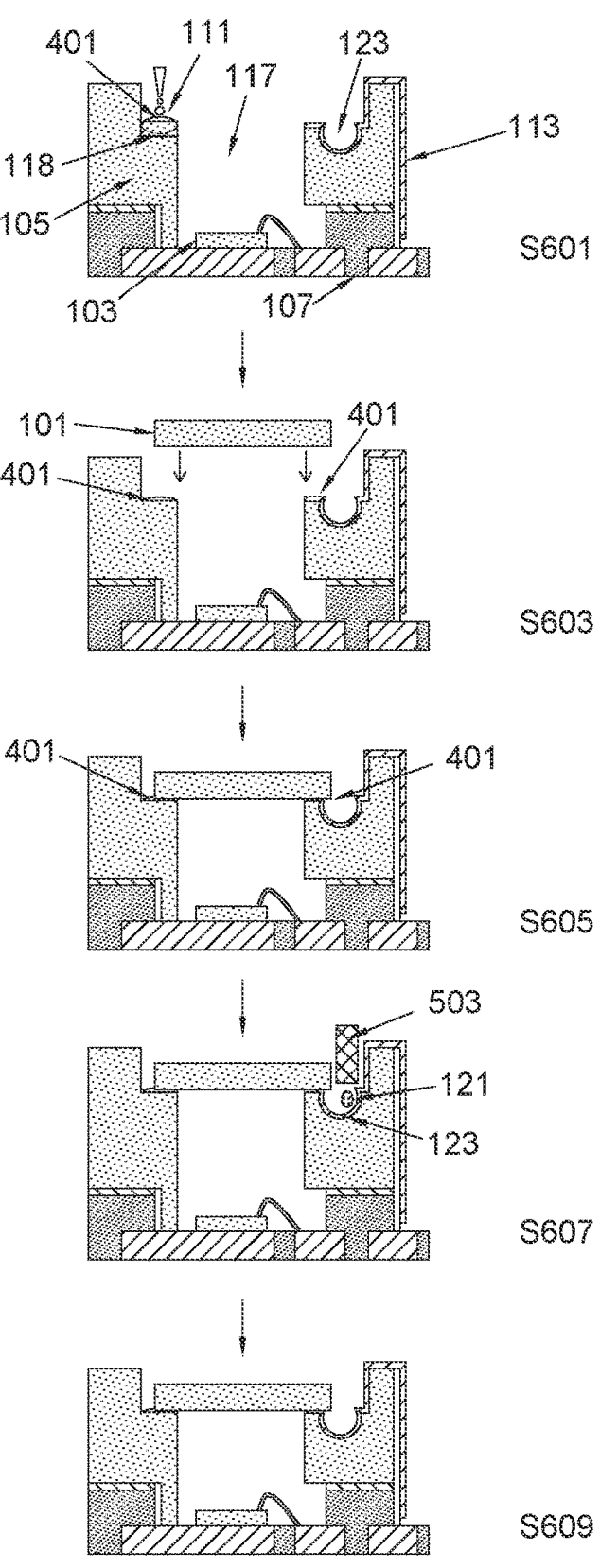
FIG. 5 shows a method of assembling the infrared illuminator according to an embodiment.

FIG. 5 shows the steps for attaching the MLA glass within the package according to an embodiment, with the package shown in schematic cross-section.

In step S601, mechanical adhesive 111, such as epoxy, is dispensed to the surface of the socket of the spacer 105 between the standoffs 401 with a nozzle 503, as discussed above in relation to FIG. 4. The standoffs 401 provide a barrier preventing the mechanical adhesive running into the recesses 123 during this step.

In step S603, the MLA glass 101 is inserted into the socket 117 of the spacer, such that it is supported by the standoffs 401. The correct positioning of the MLA glass 101 in the z-direction with respect to the VCSEL distance is ensured by the height of the standoffs 401. In the x/y plane, correct positioning of the MLA glass 101 is achieved by alignment with standard alignment marks. In an embodiment, correct positioning of the MLA glass 101 may be achieved by aligning the MLA glass 101 with the VCSEL 103 edges. In an embodiment, the MLA glass 101 is positioned by a pick and place machine in accordance with methods known in the art.

In step S605, a hard bake of the epoxy is carried out. In an embodiment, this comprises simply heating the module according to the curing temperature profile of the epoxy. In another embodiment this may comprise spot-curing the adhesive 111 using UV light in order to hold it in position prior to carrying out thermal curing of the adhesive.

Once the curing of the mechanical adhesive is complete, the position of the MLA glass 101 is fixed in the x, y and z planes and correct alignment with the VCSEL 103 is assured for the remaining steps described below.

In step S607, the electrically conductive paste 121 is inserted into the recesses 123 using either a standard dispensing or jetting process, both of which are well known in the art.

Figure 6:
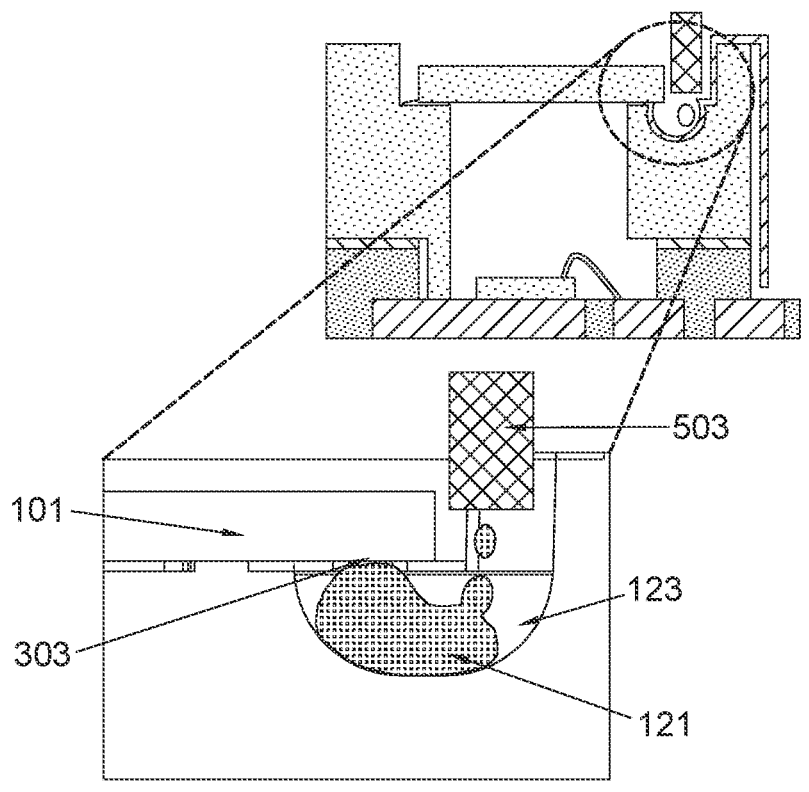
FIG. 6 shows one of the steps of the method of FIG. 5 in detail.

FIG. 6 shows an enlarged image of this step using dispenser 503 in the form of a nozzle or needle, as appropriate. As can be seen, the cap shape of the recess 123 according to this embodiment drives the conductive paste 121 up towards the base of the MLA glass 101, ensuring electrical connection between electrical contact pads 305 on the base of the MLA glass 101 and the lead. The cap shape geometry therefore ensures proper flow of the electrically conductive paste. As can be seen from this figure, the cap shape redirects that electrically conductive paste to the bottom of the MLA where the electrical contact pads are located. The shape pushes the paste against the bottom of the MLA glass.

Note that, in this embodiment, the recesses 123 are fully electrically plated therefore the insertion of the paste into the recesses does not have to be done with high precision.

The skilled person will appreciate that electrically conductive paste is sufficiently viscous that fluid dynamics do not need to be taken into account.

In step S609, the hard bake of the electrically conductive paste 121 is performed. In an embodiment, this comprises heating the module according to the curing temperature profile of the electrically conductive paste 121.

Thus, in the method of FIG. 6, the hard baking steps of the mechanical adhesive and the conductive paste are performed separately. This ensures that the glass does not move during the curing process and therefore that correct positioning of the MLA glass is maintained following the initial alignment performed using the alignment marks, as discussed above. The electrically conductive paste and the mechanical adhesive may have both different curing profiles and surface tensions, both of which could cause movement of the MLA glass during the curing process if not separated.

The skilled person will understand that in the preceding description and appended claims, positional terms such as 'above', 'along', 'side', etc. are made with reference to conceptual illustrations, such as those shown in the appended drawings. These terms are used for ease of reference but are not intended to be of limiting nature. These terms are therefore to be understood as referring to an object when in an orientation as shown in the accompanying drawings.

Embodiments of the present disclosure can be employed in many different applications including providing illumination for facial recognition sensors, for example, in smartphones and other technologies, autonomous driving, object recognition in drones, smart devices for smart home or any device or machine which is designed to recognize objects.

LIST OF REFERENCE NUMERALS 100 optoelectronic module
101 optical assembly
103 optoelectronic device
105 support structure
107 leadframe
109 electrically conductive structure
111 adhesive
113 electrically conductive lead
117 socket
118 surface
119 adhesive layer
120 sidewall
121 electrically conductive fluid
123 recess
125 electrically conductive fluid
301 electrical connection
302 distance between optoelectronic device and optical assembly
303 conductive pad
401 spacer
403 cavity
503 dispenser
S601 step of applying adhesive
S603 step of positioning optical assembly
S605 step of curing adhesive
S607 step of applying conductive fluid
S609 step of curing conductive fluid Although the disclosure has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in any embodiments, whether alone or in any appropriate combination with any other feature disclosed or illustrated herein.

The invention claimed is:

1. A support structure for mounting an optical assembly above an optoelectronic device, the optical assembly comprising an electrically conductive structure, the support structure comprising:

a first surface for supporting the optical assembly;

a spacer on the first surface;

an electrically conductive lead comprising a first electrical interface portion adjacent to the first surface; and a first recess in the first surface, wherein the first recess comprises one or more walls defining a volume for receiving an electrically conductive fluid, wherein the volume is open at the first surface but is otherwise closed, and wherein at least a portion of the one or more walls of the recess is formed from the first electrical interface portion of the electrically conductive lead such that the electrically conductive fluid received in the recess maintains the first electrical interface portion of the electrically conductive lead and the electrically conductive structure of the optical assembly supported by the surface in electrical connection.

2. The support structure of claim 1, wherein all of the one or more walls of the first recess is or are formed from the first interface portion of the electrically conductive lead.

3. The support structure of claim 1, further comprising a plurality of sidewalls extending from the first surface such that the sidewalls define a continuous border surrounding the optical assembly supported by the first surface.

4. The support structure of claim 1, wherein the support structure is electrically insulating, save for the electrically conductive lead.

5. The support structure of claim 1, wherein the first recess is positioned such that it is at least partially covered by the optical assembly supported on the first surface.

6. The support structure of claim 5, wherein the first recess is positioned such that a portion of the recess remains uncovered when the optical assembly is supported on the first surface.

7. The support structure of claim 1, wherein one or more walls of the first recess is or are substantially curved.

8. The support structure of claim 7, wherein the first recess has a substantially recessed spherical cap shape or recessed ellipsoidal cap shape.

9. The support structure of claim 1, wherein the electrically conductive fluid is a conductive epoxy.

10. The support structure of claim 1, wherein the electrically conductive fluid a heat-curable fluid.

11. An optoelectronic module comprising:

the support structure of claim 1;

the optical assembly comprising the electrically conductive structure positioned on the first surface;

a mechanical adhesive attaching the optical assembly to the first surface; and the electrically conductive fluid disposed in the first recess and in contact with the electrically conductive structure, so as to maintain the electrically conductive lead and the electrically conductive structure in electrical connection.

12. The optoelectronic module of claim 11, further comprising:

an electrically conductive trace;

the optoelectronic device mounted on the electrically conductive trace and being operable to emit or detect light through the optical assembly, wherein the electrically conductive lead is in electrical connection with the electrically conductive trace.

13. A method of manufacturing the optoelectronic module of claim 11, the method comprising:

applying the mechanical adhesive to the first surface;

positioning the optical assembly on the first surface;

thermally curing the mechanical adhesive;

once the mechanical adhesive is thermally cured, introducing the electrically conductive fluid into the first recess;

thermally curing the electrically conductive fluid.

14. The method of claim 13, wherein, prior to thermally curing the adhesive, the adhesive is partially cured using ultraviolet light.

15. The support structure of claim 1, wherein the electrically conductive structure comprises an electrical trace that is substantially transparent to a wavelength of light produced by the optoelectronic device.

16. The support structure of claim 15, wherein the electrical trace is disposed on a surface of the optical assembly and configured to detect moisture on the surface of the optical assembly.

* * * * *